(12) United States Patent
Kawasaki

(10) Patent No.: US 7,902,914 B2
(45) Date of Patent: Mar. 8, 2011

(54) SEMICONDUCTOR INTEGRATED CIRCUIT

(75) Inventor: Kenichi Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 2 days.

(21) Appl. No.: 12/434,404

(22) Filed: May 1, 2009

(65) Prior Publication Data
US 2009/0322406 A1 Dec. 31, 2009

(30) Foreign Application Priority Data

Jun. 25, 2008 (JP) ................. 2008-166152

(51) Int. Cl.
G05F 1/10 (2006.01)
G05F 3/02 (2006.01)
(52) U.S. Cl. ........................ 327/544; 327/313
(58) Field of Classification Search .................. 327/544, 327/546, 309, 310, 313
See application file for complete search history.

(56) References Cited

U.S. PATENT DOCUMENTS

| | | | |
|---|---|---|---|
| 6,272,577 B1 * | 8/2001 | Leung et al. | 710/110 |
| 6,333,661 B1 * | 12/2001 | Ando et al. | 327/313 |
| 6,351,171 B1 * | 2/2002 | Balhiser | 327/318 |
| 6,954,103 B2 * | 10/2005 | Yamauchi et al. | 327/540 |
| 2006/0152202 A1 * | 7/2006 | Okubo et al. | 323/276 |
| 2007/0053115 A1 * | 3/2007 | Tain et al. | 361/18 |
| 2007/0145922 A1 | 6/2007 | Ito et al. | |

FOREIGN PATENT DOCUMENTS

| | | |
|---|---|---|
| JP | 2000-013215 A | 1/2000 |
| JP | 2004-350058 A | 12/2004 |
| JP | 2007-179345 A | 7/2007 |

OTHER PUBLICATIONS

Yusuke Kanno et al.; "29.4 Hierarchical Power Distribution with 20 Power Domains in 90-nm Low-Power Multi-CPU Processor"; ISSCC; pp. 540-541 & p. 671; 2006.

* cited by examiner

Primary Examiner — Quan Tra
(74) Attorney, Agent, or Firm — Arent Fox, LLP

(57) ABSTRACT

A semiconductor integrated circuit includes a core circuit, a power supply switch situated on a path providing a current to the core circuit and configured to control a state of current supply to the core circuit in response to a control signal applied to a control node, a clamp circuit configured to clamp a voltage of the control signal, and a switching circuit configured to control whether to enable or disable a clamp operation of the clamp circuit.

11 Claims, 19 Drawing Sheets

US 7,902,914 B2

SEMICONDUCTOR INTEGRATED CIRCUIT

CROSS-REFERENCE TO RELATED APPLICATIONS

The present application is based upon and claims the benefit of priority from the prior Japanese Patent Application No. 2008-166152 filed on Jun. 25, 2008, with the Japanese Patent Office, the entire contents of which are incorporated herein by reference.

FIELD

The disclosures herein generally relate to semiconductor integrated circuits, and particularly relate to a semiconductor integrated circuit having a power supply control mechanism.

BACKGROUND

There is an increasing demand for lower power consumption in electronic apparatuses. As a result, large scale integration (LSI) circuits are provided with a power supply suspension function in an increasing number of cases. An LSI circuit having a power supply suspension function suspends power supply to unused circuit blocks among its internal circuit blocks to eliminate leak currents in these unused circuit blocks, thereby reducing power consumption. This function is preferable in portable communication apparatuses for which the demand for reduction of power consumption in a standby state is pressing.

[Patent Document 1] Japanese Patent Application Publication No. 2007-179345

[Patent Document 2] Japanese Patent Application Publication No. 2004-350058

[Patent Document 3] Japanese Patent Application Publication No. 2000-13215

SUMMARY

According to an aspect of the embodiment, a semiconductor integrated circuit includes a core circuit, a power supply switch situated on a path providing a current to the core circuit and configured to control a state of current supply to the core circuit in response to a control signal applied to a control node, a clamp circuit configured to clamp a voltage of the control signal, and a switching circuit configured to control whether to enable or disable a clamp operation of the clamp circuit.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
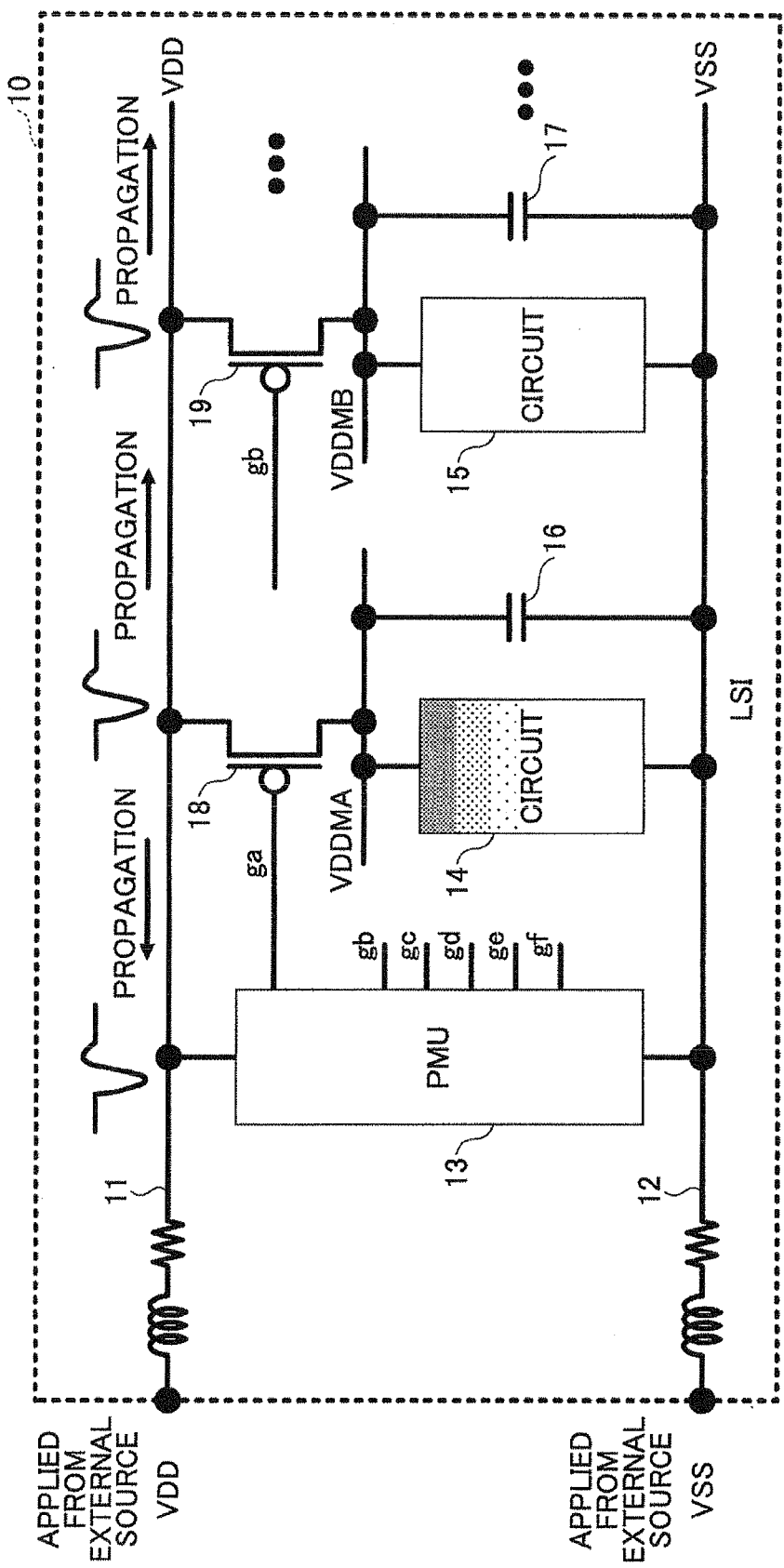
FIG. 1 is a drawing for explaining an LSI having a power supply suspension function.

FIG. 1 is a drawing for explaining an LSI having a power supply suspension function. A semiconductor integrated circuit chip 10 includes a HIGH-side power supply line 11, a LOW-side power supply line 12, a power management unit (PMU) 13, a circuit block 14, a circuit block 15, a stabilizing capacitance 16, a stabilizing capacitance 17, and PMOS transistors 18 and 19 serving as power switches. The stabilizing capacitance 16 is provided between the HIGH side and LOW side of the power supply voltage applied to the circuit block 14 for the purpose of stabilizing the power supply voltage of the circuit block 14. In an example illustrated in FIG. 1, the PMOS transistor 18 serving as a power switch is provided at the HIGH side of the power supply voltage of the circuit block 14. The power management unit 13 controls a gate control signal ga applied to the gate of the PMOS transistor 18, thereby choosing to provide or not to provide power to the circuit block 14. The circuit block 15 is provided with the same configuration as that for the circuit block 14.

With the power suspension function, the power supply to the circuit block 14 may be suspended. When the suspended state continues, the electric charge of the stabilizing capacitance 16 and the electric charge inside the circuit block 14 are all discharged through leak current paths. As a result, a voltage VDDMA drops close to a ground voltage VSS. In this state, the power management unit 13 may place the PMOS transistor 18 in a conductive state to resume the provision of power supply to the circuit block 14. In response, a large amount of rush current is generated to charge the stabilizing capacitance inside the circuit block 14. The flow of this rush current generates power supply noise (i.e., dynamic IR-drop) on the HIGH-side power supply line 11, and such noise propagates through the HIGH-side power supply line 11 to reach various parts of the semiconductor integrated circuit chip 10 to affect their operations. For example, the power supply voltage of the circuit block 15 and the power management unit 13 may fluctuate, thereby causing malfunction in these circuits.

Figure 2:
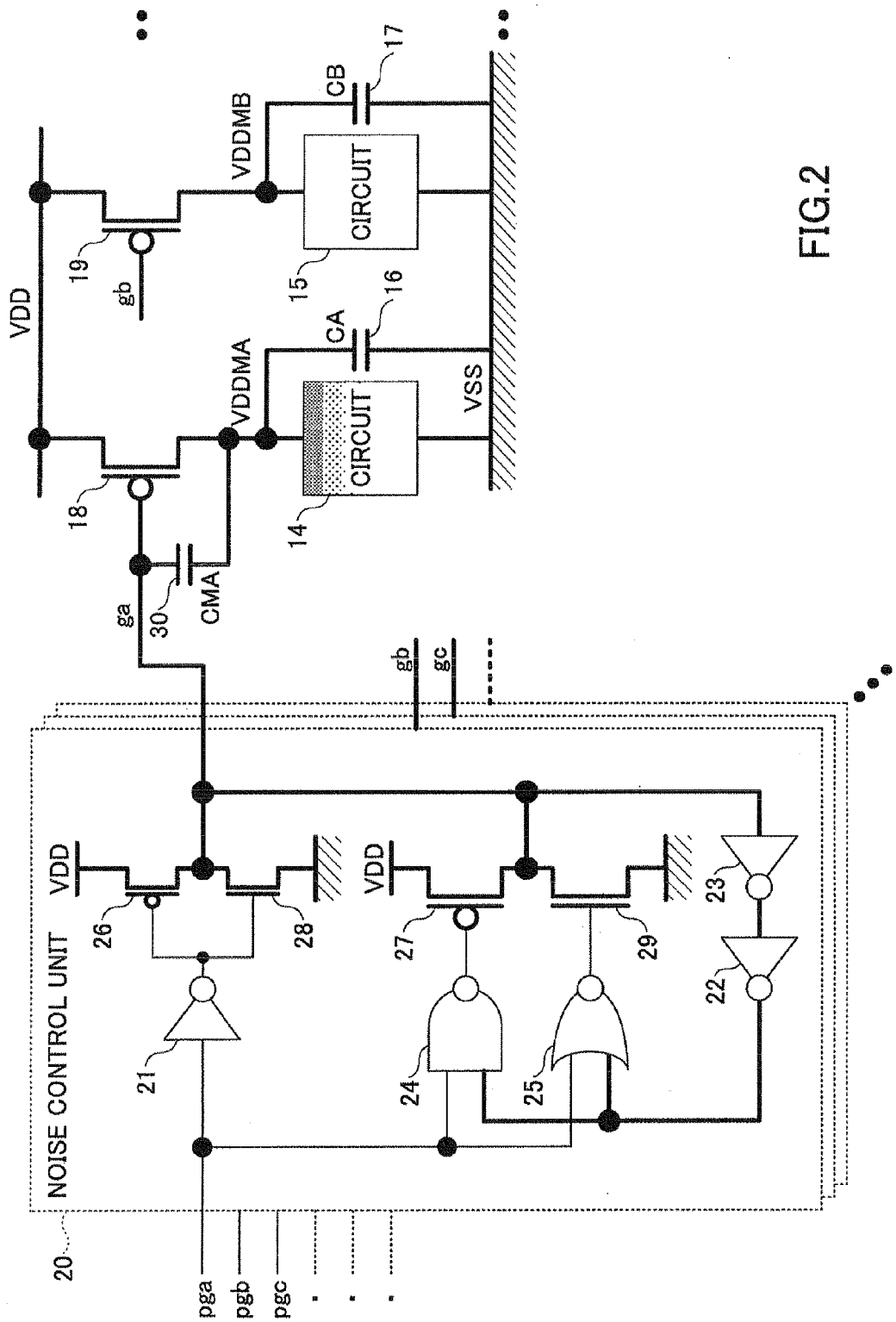
FIG. 2 is a drawing illustrating an example of the circuit configuration that prevents the occurrence of an excessive rush current.

FIG. 2 is a drawing illustrating an example of the circuit configuration that prevents the occurrence of an excessive rush current. In FIG. 2, the same elements as those of FIG. 1 are referred to by the same numerals, and a description thereof will be omitted. In the configuration illustrated in FIG. 2, a plurality of noise control units 20 are provided between the power management unit 13 and the PMOS transistors serving as power switches. Each of the noise control units 20 receives a corresponding control signal (e.g., pga) from the power management unit 13, and supplies a gate control signal (e.g., ga) to the gate of a corresponding PMOS transistor. Each of the noise control units 20 includes inverters 21 through 23, a NAND gate 24, a NOR gate 25, PMOS transistors 26 and 27, and NMOS transistors 28 through 29.

When the circuit block 14 is in the power-supply-suspended state, the power management unit 13 may place the PMOS transistor 18 in a conductive state to resume the provision of power supply to the circuit block 14. In such a case, the control signal pga is changed to LOW, thereby making the PMOS transistor 26 nonconductive and making the NMOS transistor 28 conductive. Also, the PMOS transistor 27 is placed in a nonconductive state. The NMOS transistor 28 is designed such that its output drive power is relatively weak, and its ON current is relatively small. Since a small amount of electric current runs through the NMOS transistor 28, a capacitance 30 serving as a mirror cap is gradually discharged. As the voltage of the gate control signal ga of the mirror cap capacitance 30 drops below the threshold voltage of the PMOS transistor 18, the PMOS transistor 18 becomes conductive to start the charging of the stabilizing capacitance 16. As the stabilizing capacitance 16 charges, the voltage VDDMA rises. A rise in the voltage VDDMA causes a rise in the gate voltage of the PMOS transistor 18 that is capacitance coupled to the voltage VDDMA through the mirror cap capacitance 30. Due to the rise of this gate voltage which is the gate control signal ga, the amount of current flowing through the PMOS transistor 18 decreases to suppress the speed of rise in the voltage VDDMA. As a result, the voltage of the gate control signal ga stays around the threshold voltage of the PMOS transistor 18, thereby allowing only a small amount of current to flow through the PMOS transistor 18 to gradually charge the stabilizing capacitance 16. Namely, the voltage VDDMA gradually rises.

The gate control signal ga is applied to one input of the NAND gate 24 and one input of the NOR gate 25 through the inverters 22 and 23. The other input of the NAND gate 24 and the other input of the NOR gate 25 receive the control signal pga from the power management unit 13. Accordingly, the NMOS transistor 29 becomes conductive upon the passage of a predetermined delay time that is introduced by the inverters 22 and 23 and the NOR gate 25. This predetermined time is designed to be sufficient for the voltage VDDMA to gradually increase and reach a level approximately equal to the voltage VDD. Further, the NMOS transistor 29 is designed such that its output drive power is sufficiently strong, and its ON current is sufficiently large. Accordingly, the NMOS transistor 29 pulls down the voltage of the gate control signal ga to the ground voltage after the voltage VDDMA on a gradual increase reaches almost the voltage VDD. The PMOS transistor 18 thus becomes fully conductive, so that a sufficient amount of current can be supplied after the start of operation of the circuit block 14.

Figure 3:
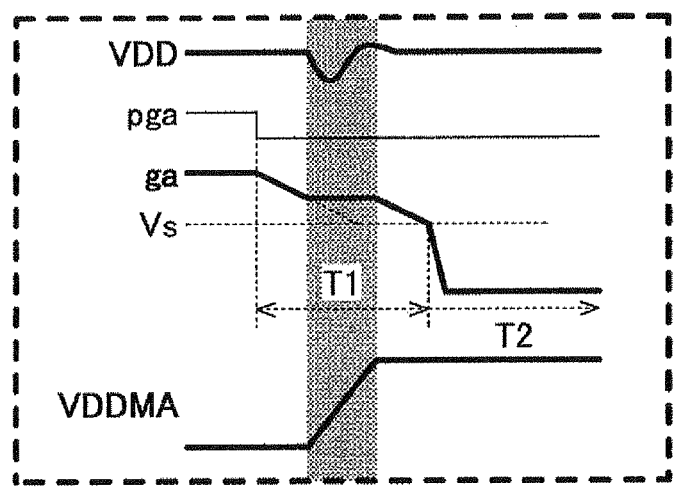
FIG. 3 is a drawing illustrating signal waveforms indicative of the operation of the circuit depicted in FIG. 2.

FIG. 3 is a drawing illustrating signal waveforms indicative of the operation of the circuit depicted in FIG. 2. As the control signal pga is changed to LOW, the voltage of the gate control signal ga gradually decreases. After the gate control signal ga reaches the threshold voltage of the PMOS transistor 18, the gate control signal ga stays at the same level as the threshold voltage. While the gate control signal ga stays at the threshold voltage level, the voltage VDDMA gradually increases. Upon the voltage VDDMA reaching the maximum voltage (which is approximately equal to VDD), the gate control signal ga starts a gradual decrease. After the passage of a predetermined time T1 following the change of the control signal pga to LOW, the voltage of the gate control signal ga is pulled down to the ground voltage by a strong force. In a period T2, the voltage VDDMA is stably kept at the maximum voltage.

The use of the configuration illustrated in FIG. 2 makes it possible to gradually increase the voltage VDDMA, i.e., to suppress a current flowing through the PMOS transistor 18 to a small amount. With this arrangement, power supply noise in the power supply voltage VDD caused by a rush current is inhibited, thereby preventing circuit malfunction. In order to achieve proper operations as illustrated in FIG. 3, however, various circuit parameters regarding the configuration illustrated in FIG. 2 may need to be set to proper values. Such circuit parameters include, among other things, the drive power of the NMOS transistor 28, the capacitance CA of the stabilizing capacitance 16, the capacitance CMA of the mirror cap capacitance 30, and the leak current of the circuit block 14. If any one of these circuit parameters deviates from its proper setting value, the gate control signal ga cannot be maintained close to the threshold voltage level.

Figure 4:
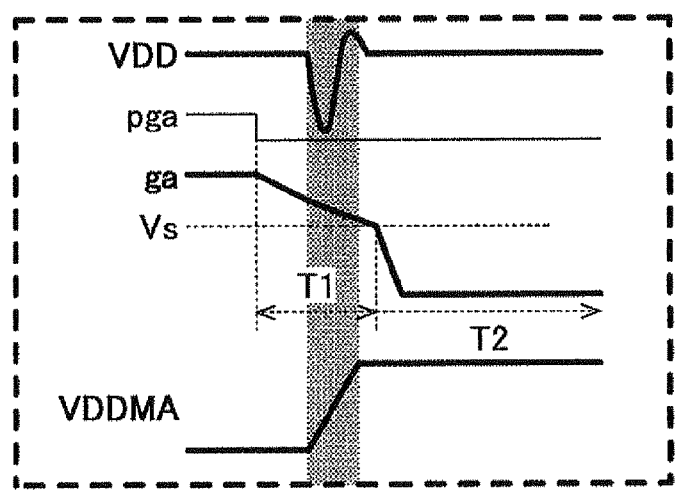
FIG. 4 is a drawing illustrating signal waveforms indicative of the operation of the circuit depicted in FIG. 2 when some setting values of circuit parameters are not appropriate.

FIG. 4 is a drawing illustrating signal waveforms indicative of the operation of the circuit depicted in FIG. 2 when some setting values of circuit parameters are not appropriate. In this example of operations, the voltage of the gate control signal ga continues to drop without staying in the vicinity of the threshold voltage level. As a result, the speed of rise of the voltage VDDMA is faster than in the case depicted in FIG. 3. Namely, power supply noise in the power supply voltage VDD is greater in the operation example illustrated in FIG. 4 than in the operation example illustrated in FIG. 3. Such phenomenon may occur when the drive power of the NMOS transistor 28 is excessively large, when the capacitance CA of the stabilizing capacitance 16 is excessively large, when the capacitance CMA of the mirror cap capacitance 30 is excessively small, or when the leak current of the circuit block 14 is excessively large.

In order to avoid malfunction caused by deviation of such circuit parameters from their setting values, the drive power of the NMOS transistor 28 may preferably be set to a sufficiently small value to allow a margin of error. With such an arrangement, the speed of charging of the stabilizing capacitance 16 becomes excessively slow, thereby requiring a lengthy time for the power supply of the circuit block 14 to be resumed.

In the following, embodiments of the present invention will be described with reference to the accompanying drawings.

Figure 5:
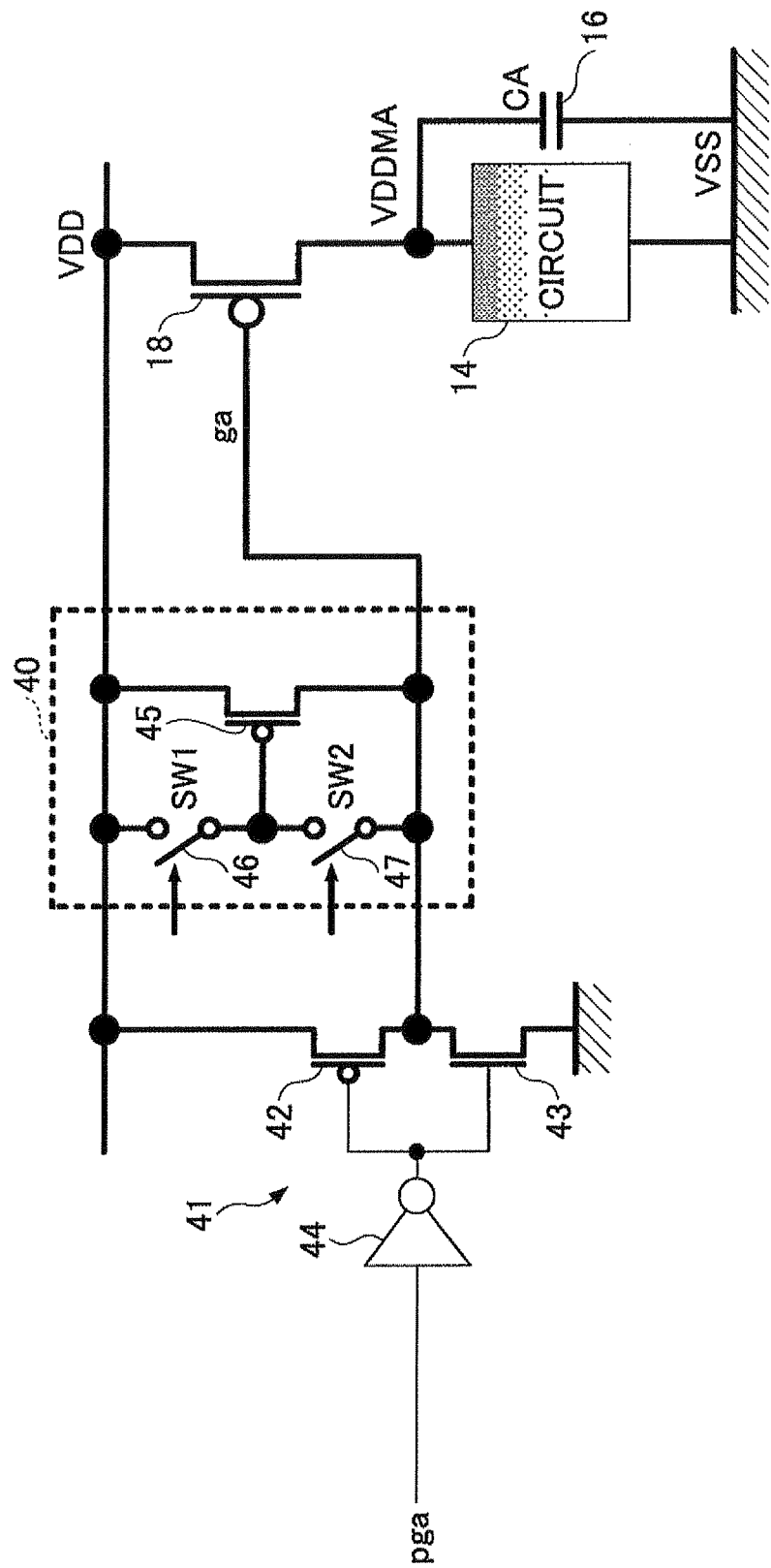
FIG. 5 is a drawing illustrating an example of the circuit configuration that suppresses the occurrence of an excessive rush current.

FIG. 5 is a drawing illustrating an example of the circuit configuration that suppresses the occurrence of an excessive rush current. In FIG. 5, elements having the same functions as those of FIG. 1 are referred to by the same numerals, and a description thereof will be omitted. In the configuration illustrated in FIG. 5, a clamp circuit 40 and a control signal drive circuit 41 are used to control the gate control signal ga supplied to the gate of the PMOS transistor 18. The clamp circuit 40 and the control signal drive circuit 41 are situated between the power management unit 13 illustrated in FIG. 1 and the PMOS transistor 18. The control signal drive circuit 41 drives the gate control signal ga in response to the control signal pga generated by the power management unit 13. The clamp circuit 40 clamps the voltage of the gate control signal ga to a predetermined voltage.

The clamp circuit 40 includes a PMOS transistor 45 and switching circuits 46 and 47. Respective connection states of the switching circuits 46 and 47 are controlled by switching control signals SW1 and SW2, respectively. The control signal drive circuit 41 includes an inverter 44, a PMOS transistor 42, and an NMOS transistor 43. The control signal drive circuit 41 couples the gate node of the PMOS transistor 18 to either the power supply voltage VDD or the power supply voltage VSS in response to the control signal pga supplied from the power management unit 13.

The PMOS transistor 18 is provided on the path through which the power supply voltage VDD is provided to the circuit block 14. The PMOS transistor 18 is placed in a conductive state responsive to the gate control signal ga applied to the control node (i.e., gate node) thereof, thereby serving as a power supply switch for controlling the state of the provision of power supply to the circuit block 14. The PMOS transistor 18 is placed in an ON state (i.e., conductive state) when the gate control signal ga is equal to the power supply voltage VSS, thereby providing power supply to the circuit block 14. The PMOS transistor 18 is placed in an OFF state (i.e., nonconductive state) when the gate control signal ga is equal to the power supply voltage VDD, thereby suspending power supply to the circuit block 14. In order to change the state of provision of power supply to the circuit block 14 from the suspended state to the provided state, the control signal drive circuit 41 changes the connection state of the control node (i.e., the gate node of the PMOS transistor 18) from a state in which the control node is connected to the power supply voltage VDD to a state in which the control node is connected to the power supply voltage VSS (i.e., ground voltage).

The clamp circuit 40 serves to clamp the gate control signal ga to a predetermined voltage. The clamp circuit 40 is configured such that its clamp operation is enabled or disabled in a controlled manner in response to the connection states of the switching circuits 46 and 47. The clamp operation of the clamp circuit 40 is enabled when the state of provision of power supply to the circuit block 14 is to be changed by the PMOS transistor 18 from a suspended state to a provided state. The enabled clamp operation of the clamp circuit 40 serves to clamp the gate control signal ga to a predetermined voltage, thereby placing the PMOS transistor 18 in a half-conductive state between the fully conductive state and the fully nonconductive state. Namely, the clamp function of the clamp circuit 40 ensures that the gate control signal ga is set to a voltage level that is lower than the power supply voltage VDD by a margin equal to the threshold voltage of the PMOS transistor 45. It should be noted that the threshold voltage of the PMOS transistor 45 is substantially the same as the threshold voltage of the PMOS transistor 18. As a result, the PMOS transistor 18 is placed in a boundary state between the conductive state and the nonconductive state, so that its channel resistance assumes a midpoint value between zero and infinity.

In this manner, the PMOS transistor 18 is placed in a half-conductive state at the time of resuming power supply to the circuit block 14, so that the amount of current flowing through the PMOS transistor 18 is set to a small amount that is no more than necessary. This arrangement prevents an excessive rush current from flowing into the circuit block 14 and the stabilizing capacitance 16, thereby avoiding the occurrence of power supply noise in the power supply voltage VDD.

The threshold voltage of the PMOS transistor 45 is related to threshold voltage of the PMOS transistor 18. Namely, the threshold voltage of the PMOS transistor 45 and the threshold voltage of the PMOS transistor 18 exhibit similar changes when transistor thresholds vary due to manufacturing variation and/or temperature change. Even in the presence of manufacturing variation or temperature change, thus, a rush current can be effectively suppressed.

The PMOS transistor 18 is preferably placed in a conductive state to supply a sufficient amount of current to the circuit block 14 when the circuit block 14 is in the operating state with the provided power supply. In consideration of this, the clamp operation of the clamp circuit 40 is enabled when changing the state of provision of power supply to the circuit block 14 from a suspended state to a provided state, and is disabled thereafter. The clamp operation of the clamp circuit 40 is changed to a disabled state after the power supply voltage VDDMA applied to the circuit block 14 reaches a predetermined voltage level (e.g., the operating voltage of the circuit block 14).

Figure 6:
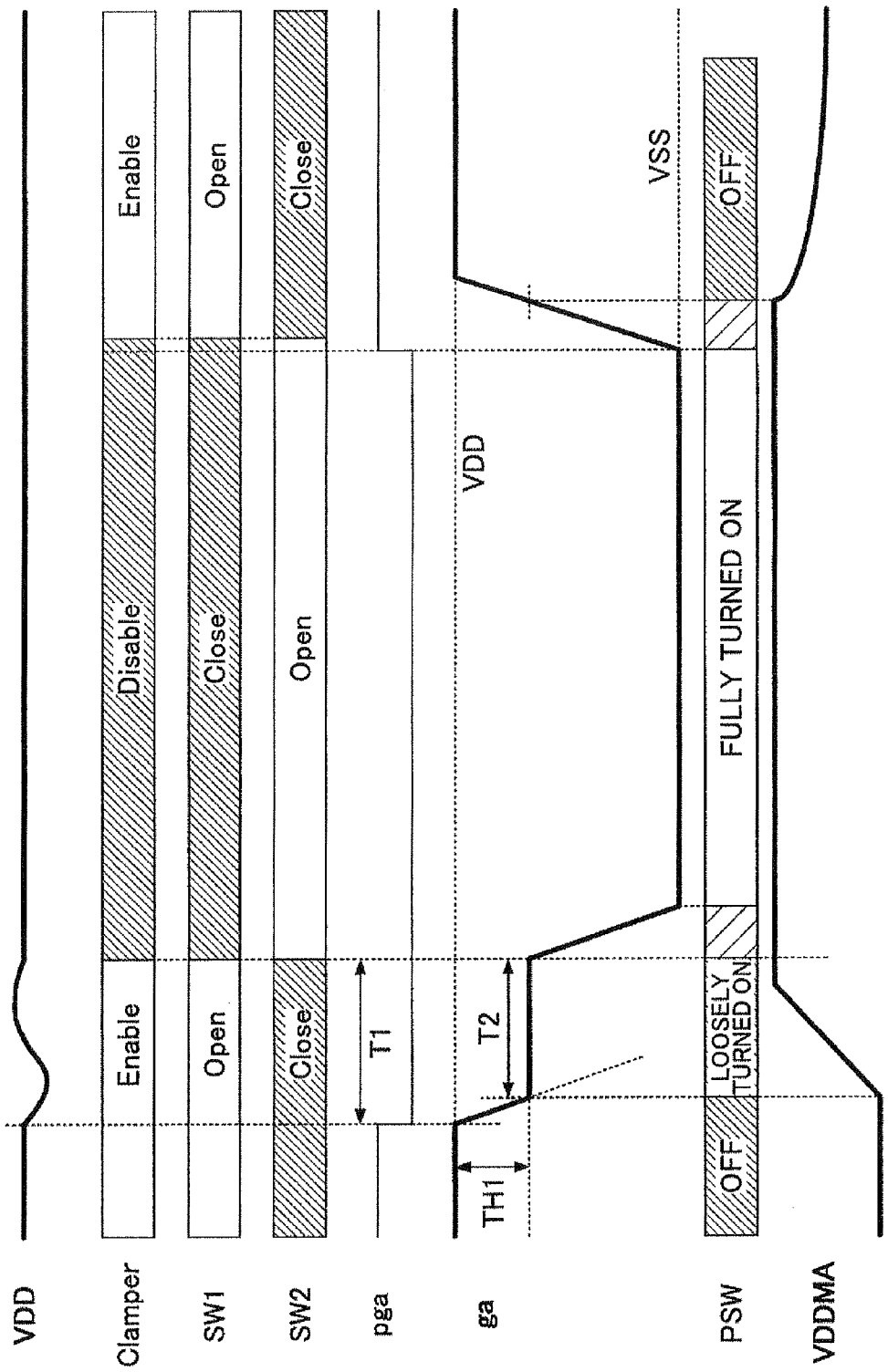
FIG. 6 is a drawing illustrating signal waveforms indicative of the operation of the circuit depicted in FIG. 5.

FIG. 6 is a drawing illustrating signal waveforms indicative of the operation of the circuit depicted in FIG. 5. In an initial state, the switching circuits 46 and 47 are placed in an open state (i.e., nonconductive state) and a closed state (i.e., conductive state) by the control signals SW1 and SW2, respectively, thereby enabling the clamp function of the clamp circuit (clamper) 40. As the control signal pga is changed to LOW, the voltage of the gate control signal ga starts dropping. Upon the drop of the gate control signal ga reaching a threshold voltage TH1 of the PMOS transistor 45, the gate control signal ga is clamped to the threshold voltage TH1 by the clamp function. While the gate control signal ga is clamped to the threshold voltage TH1, the PMOS transistor 18 is in a half-conductive state (i.e., loosely turned-on state), so that the voltage VDDMA gradually rises. After the voltage VDDMA reaches its maximum voltage (which is approximately equal to VDD), the switching circuits 46 and 47 are placed in a closed state (i.e., conductive state) and an open state (i.e., nonconductive state), respectively, to disable the clamp function of the clamp circuit 40 upon the passage of the predetermined time period T1 that starts running from the change of the control signal pga to LOW. As a result of the disabling of the clamp function, the control signal drive circuit 41 pulls down the voltage of the gate control signal ga to the ground voltage by a sufficiently strong force.

The time period T2 illustrated in FIG. 6 refers to a period in which the voltage of the gate control signal ga is clamped to the threshold voltage TH1 by the clamp function. The provision of power supply to the circuit block 14 may be suspended again by turning off the PMOS transistor 18. In such a case, the switching circuits 46 and 47 are placed in a nonconductive state and a conductive state by the control signals SW1 and SW2, respectively, to enable the clamp function of the clamp circuit 40, as illustrated in FIG. 6. In this manner, the clamp circuit 40 is made ready in preparation for the resumption of power supply.

Figure 7:
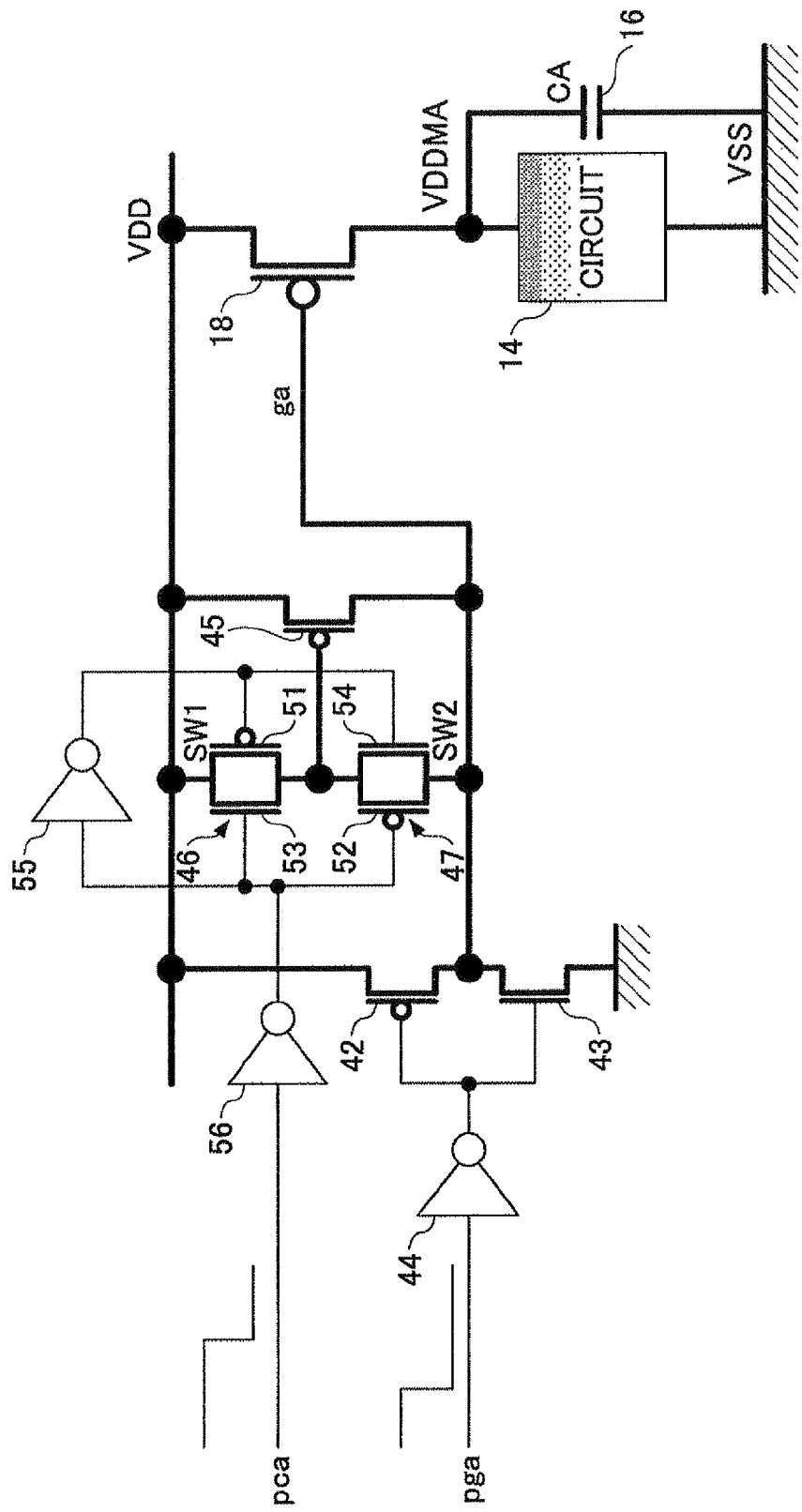
FIG. 7 is a drawing illustrating a specific example of the configuration of the circuit illustrated in FIG. 5.

FIG. 7 is a drawing illustrating a specific example of the configuration of the circuit illustrated in FIG. 5. In FIG. 7, the same elements as those of FIG. 5 are referred to by the same numerals, and a description thereof will be omitted. In the circuit illustrated in FIG. 7, the switching circuit 46 is implemented by use of a transmission gate comprised of a PMOS transistor 51 and an NMOS transistor 53 that are connected in parallel to each other. Further, the switching circuit 47 is implemented by use of a transmission gate comprised of a PMOS transistor 52 and an NMOS transistor 54 that are connected in parallel to each other. The conductive and nonconductive states of these transmission gates are controlled by a control signal pca supplied through inverters 55 and 56.

Figure 8:
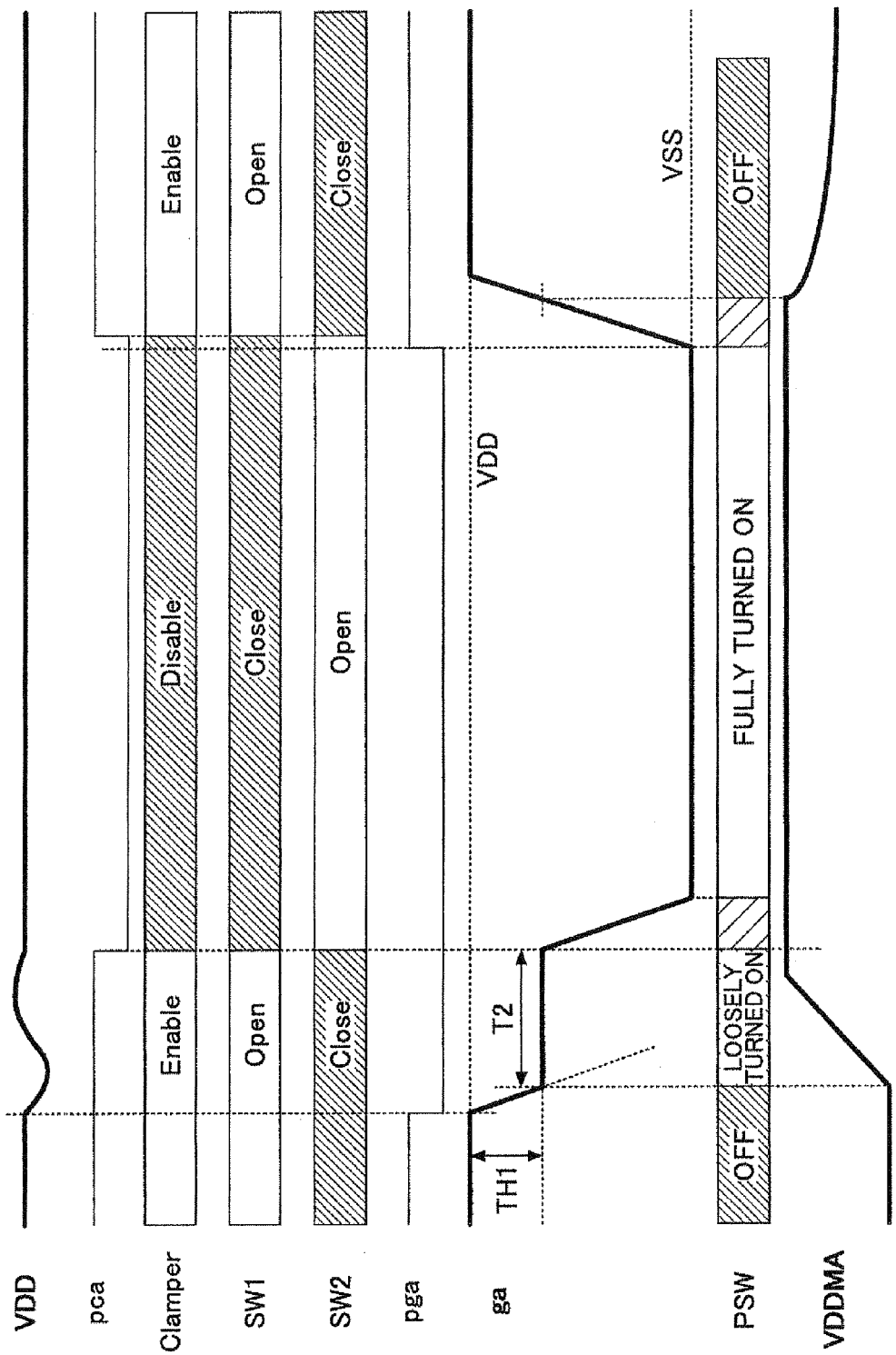
FIG. 8 is a drawing illustrating signal waveforms indicative of the operation of the circuit depicted in FIG. 5.

FIG. 8 is a drawing illustrating signal waveforms indicative of the operation of the circuit depicted in FIG. 5. The signal waveforms illustrated in FIG. 8 are the same as the signal waveforms illustrated in FIG. 6, except that the signal waveform of the control signal pca is additionally illustrated. As illustrated in FIG. 8, the control signal pca is changed from HIGH to LOW after the voltage VDDMA reaches its maximum voltage (which is approximately equal to VDD) and upon the passage of the predetermined time period T1 that starts running from the change of the control signal pga to LOW. With this provision, the switching circuits 46 and 47 are placed in a closed state (i.e., conductive state) and an open state (i.e., nonconductive state) by the control signals SW1 and SW2, respectively, thereby disabling the clamp function of the clamp circuit 40.

Figure 9:
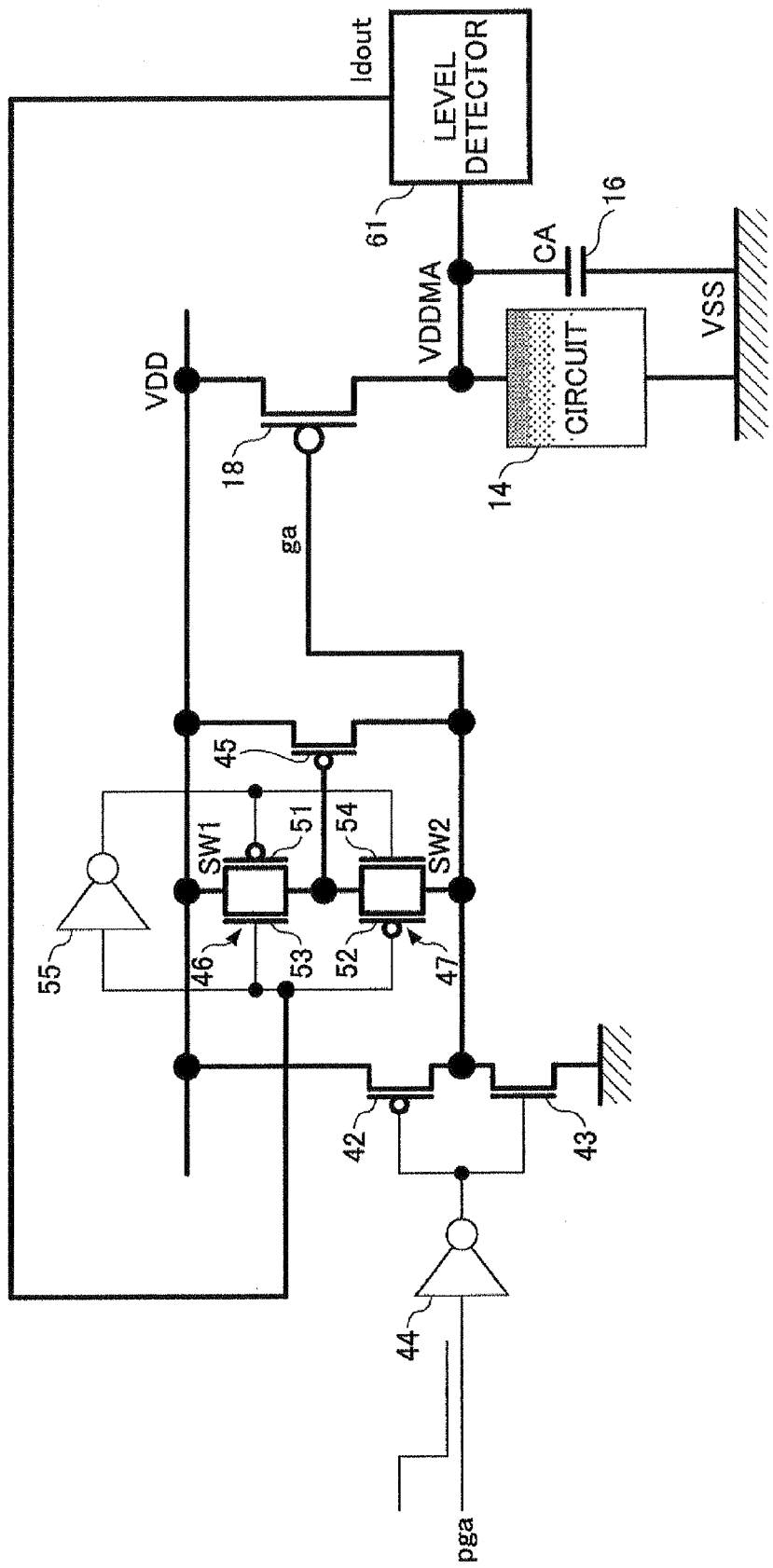
FIG. 9 is a drawing illustrating an example of the control mechanism that controls the switching of the switching circuits.

FIG. 9 is a drawing illustrating an example of the control mechanism that controls the switching of the switching circuits. In FIG. 9, the same elements as those of FIG. 5 and FIG. 7 are referred to by the same numerals, and a description thereof will be omitted. In the configuration illustrated in FIG. 9, a level detector (i.e. voltage detecting circuit) 61 is provided to generate a voltage detection signal Idout responsive to whether the power supply voltage VDDMA applied to the circuit block 14 is greater than a predetermined voltage level. The voltage detection signal Idout output from the level detector 61 is used to control whether to enable or disable the clamp operation of the clamp circuit 40. Specifically, the switching circuits 46 and 47 are placed in the nonconductive state and the conductive state, respectively, in response to the voltage detection signal Idout being LOW, thereby enabling the clamp function of the clamp circuit 40. Further, the switching circuits 46 and 47 are placed in the conductive state and the nonconductive state, respectively, in response to the voltage detection signal Idout being HIGH, thereby disabling the clamp function of the clamp circuit 40.

Figure 10:
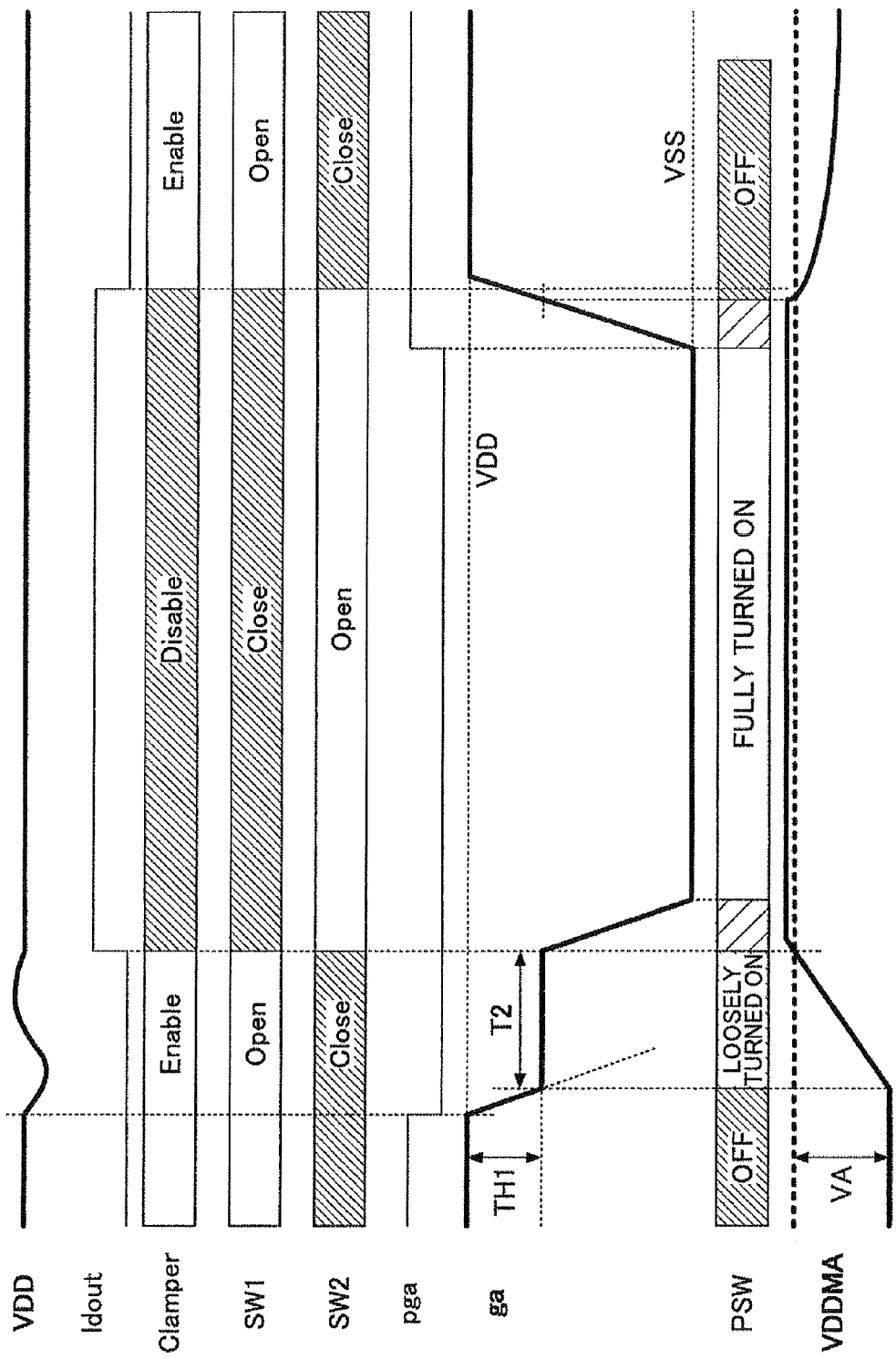
FIG. 10 is a drawing illustrating signal waveforms indicative of the operation of the circuit depicted in FIG. 9.

FIG. 10 is a drawing illustrating signal waveforms indicative of the operation of the circuit depicted in FIG. 9. The signal waveforms illustrated in FIG. 10 are the same as the signal waveforms illustrated in FIG. 6, except that the signal waveform of the voltage detection signal Idout is additionally illustrated. As illustrated in FIG. 10, the voltage detection signal Idout is changed from LOW to HIGH in response to the voltage VDDMA exceeding a predetermined voltage level VA. With this provision, the switching circuits 46 and 47 are placed in a closed state (i.e., conductive state) and an open state (i.e., nonconductive state) by the control signals SW1 and SW2, respectively, thereby disabling the clamp function of the clamp circuit 40.

Figure 11:
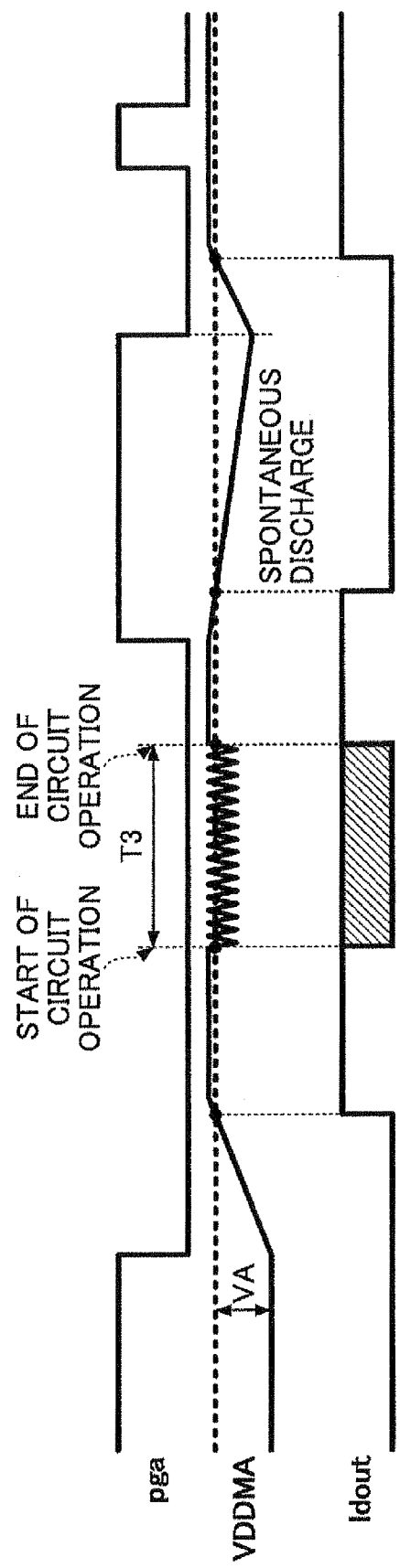
FIG. 11 is a drawing for explaining the use of the level detector.

FIG. 11 is a drawing for explaining the use of the level detector 61. In order to start the operation of the circuit block 14 by turning power on, the control signal pga is changed to LOW first, which causes the voltage VDDMA to increase, resulting in the voltage detection signal Idout being HIGH as illustrated in FIG. 11. The circuit block 14 then starts operating. The operating state of the circuit block 14 continues during a period T3. During this period, the circuit block 14 operates and consumes the power supply voltage, so that the power supply voltage VDDMA exhibits some fluctuation responsive to the circuit operation. The threshold voltage VA serving as a detection voltage at which the level detector 61 changes the value of voltage detection signal Idout is preferably close to the maximum value of the voltage VDDMA (i.e., close to the level of the power supply voltage VDDMA that is necessary for the circuit block 14 to operate) in order to avoid a rush current. Accordingly, the fluctuation of the power supply voltage VDDMA during the period T3 causes the level detector 61 to respond to this fluctuation, thereby generating jitters in the voltage detection signal Idout. Switching over between the enabled state and disabled state of clamp operation of the clamp circuit 40 thus repeatedly occurs at high speed, making the power supply voltage VDDMA unstable.

In order to avoid the above-noted situation, the level detector 61 may preferably refrain from changing the voltage detection signal Idout despite fluctuation occurring in the power supply voltage VDDMA applied to the circuit block 14 during the period in which the circuit block 14 operates. To this end, hysteresis characteristics may be introduced into the threshold check performed by the level detector 61, for example. Namely, the voltage detection signal Idout is changed to HIGH upon VDDMA exceeding the threshold voltage VA during the rise of the voltage VDDMA, and is changed to LOW upon VDDMA dropping below a threshold voltage sufficiently lower than VA during the drop of the voltage VDDMA. Alternatively, the level detector 61 may be set or reset under the control of the control signal pga that controls whether to provide or suspend power supply to the circuit block 14.

Figure 12:
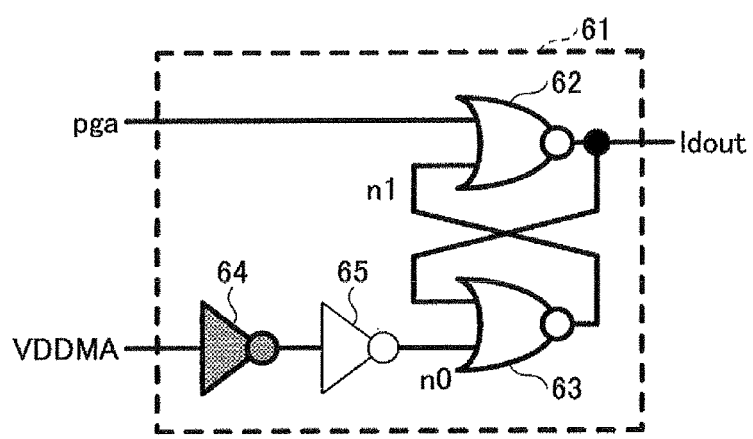
FIG. 12 is a drawing illustrating an example of the configuration of the level detector that is set or reset in response to a control signal.

FIG. 12 is a drawing illustrating an example of the configuration of the level detector 61 that is set or reset in response to the control signal pga. The level detector 61 of FIG. 12 includes NOR gates 62 and 63 and inverters 64 and 65. The NOR gates 62 and 63 provide their outputs to an input of each other, thereby constituting a latch circuit. The power supply voltage VDDMA is supplied to one input of the NOR gate 63 via the inverters 64 and 65. Further, the control signal pga is supplied to one input of the NOR gate 62. The inverter 64 is designed such that a threshold voltage of its input voltage at which its output voltage changes in response to a change in the input voltage is equal to the above-noted predetermined voltage VA.

Figure 13:
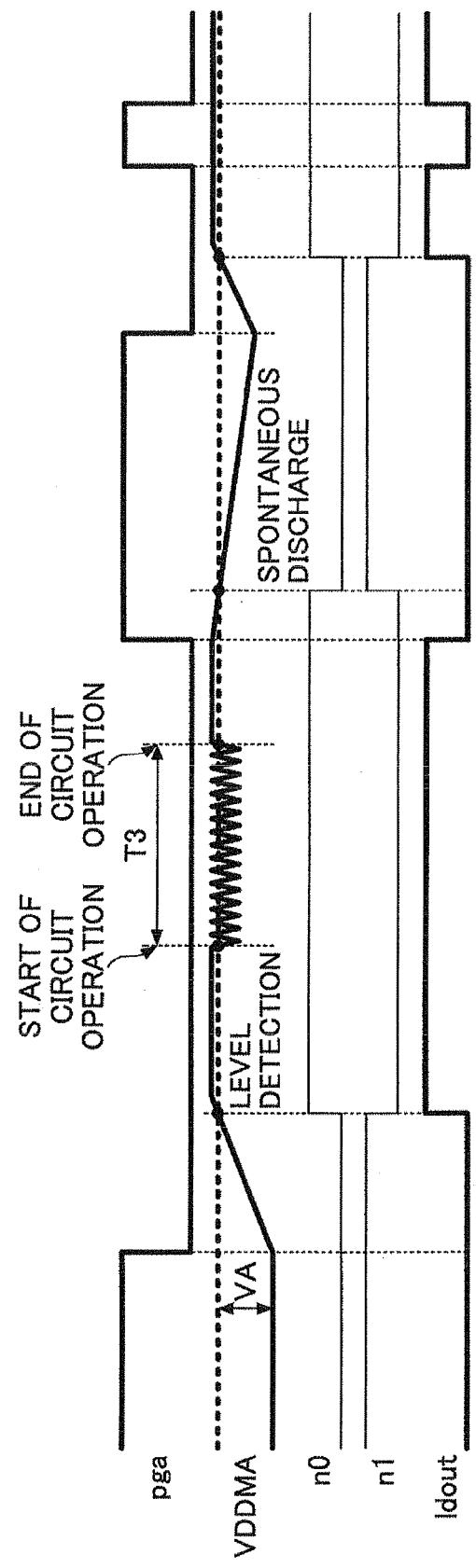
FIG. 13 is a drawing for explaining the operation of the circuit illustrated in FIG. 12.

FIG. 13 is a drawing for explaining the operation of the circuit illustrated in FIG. 12. In order to start the operation of the circuit block 14 by turning power on, the control signal pga is first changed to LOW, which causes the voltage VDDMA to increase. Upon the voltage VDDMA exceeding the predetermined threshold voltage VA, an input node n0 that is one of the input nodes of the NOR gate 63 illustrated in FIG. 12 is changed to HIGH, thereby changing an output node n1 of the NOR gate 63 to LOW. In response, the voltage detection signal Idout is changed to HIGH. During the period T3 that follows, the circuit block 14 operates and consumes the power supply voltage, so that the power supply voltage VDDMA exhibits some fluctuation responsive to the circuit operation. However, the set state of the latch comprised of the NOR gates 62 and 63 that produces the HIGH-state voltage detection signal Idout is not reset despite changes in the logic value of the input node n0. Namely, the state in which the voltage detection signal Idout is HIGH does not change despite changes in the power supply voltage VDDMA.

The control signal pga subsequently changes to HIGH. In response, the latch comprised of the NOR gates 62 and 63 is reset, thereby changing the voltage detection signal Idout to LOW. As the voltage VDDMA drops due to spontaneous discharge to go below the threshold voltage VA, the node n0 is changed to LOW, and the node n1 is changed to HIGH. The voltage detection signal Idout stays at LOW until the control signal pga is again changed to LOW to cause the voltage VDDM to exceed the threshold voltage VA.

Figure 14:
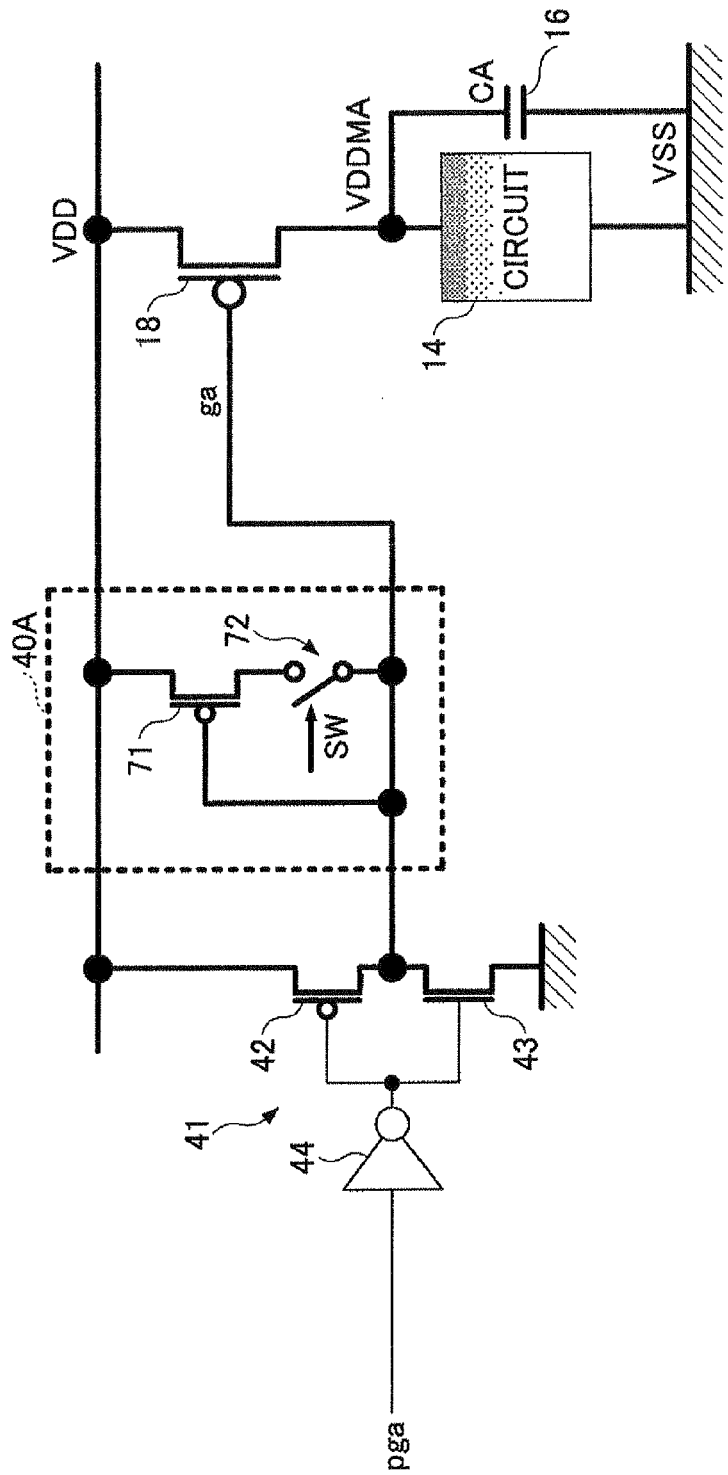
FIG. 14 is a drawing illustrating another example of the circuit configuration that suppresses the occurrence of an excessive rush current.

FIG. 14 is a drawing illustrating another example of the circuit configuration that suppresses the occurrence of an excessive rush current. In FIG. 14, the same elements as those of FIG. 5 are referred to by the same numerals, and a description thereof will be omitted. A clamp circuit 40A illustrated in FIG. 14 includes a PMOS transistor 71 and a switching circuit 72. The connection state of the switching circuit 72 is controlled by a switching control signal SW. Such a configuration can control whether to enable or disable the clamp operation of the clamp circuit 40A by use of the control signal SW, thereby achieving the same operations as those in the case of the configuration illustrated in FIG. 5.

Figure 15:
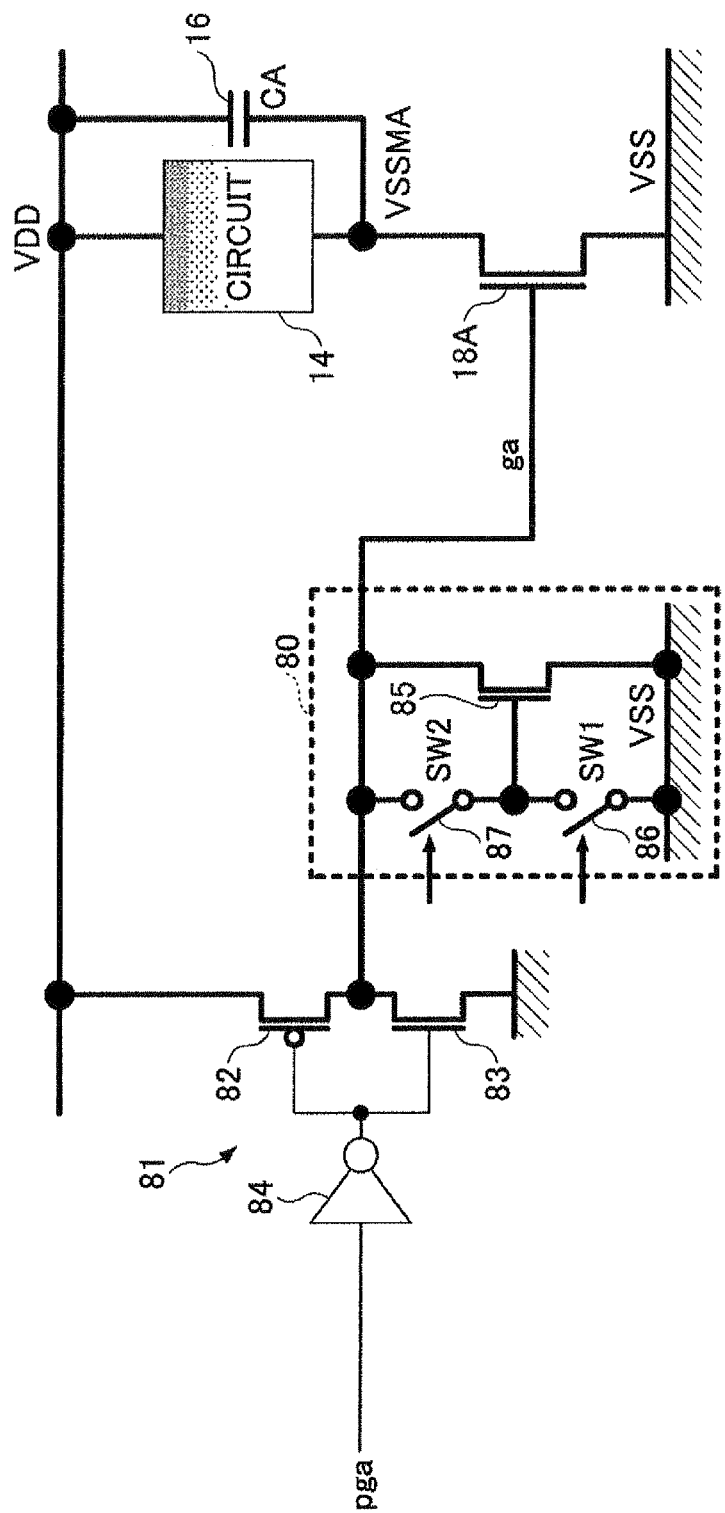
FIG. 15 is a drawing illustrating yet another example of the circuit configuration that suppresses the occurrence of an excessive rush current.

FIG. 15 is a drawing illustrating yet another example of the circuit configuration that suppresses the occurrence of an excessive rush current. In FIG. 15, the same elements as those of FIG. 5 are referred to by the same numerals, and a description thereof will be omitted. In the configuration illustrated in FIG. 15, a clamp circuit 80 and a control signal drive circuit 81 are used to control the gate control signal ga supplied to the gate of the NMOS transistor 18A. The clamp circuit 80 and the control signal drive circuit 81 are situated between the power management unit and the NMOS transistor 18A. The control signal drive circuit 81 drives the gate control signal ga in response to the control signal pga generated by the power management unit. The clamp circuit 80 clamps the voltage of the gate control signal ga to a predetermined voltage.

The clamp circuit 80 includes an NMOS transistor 85 and switching circuits 86 and 87. Respective connection states of the switching circuits 86 and 87 are controlled by switching control signals SW1 and SW2, respectively. The control signal drive circuit 81 includes an inverter 84, a PMOS transistor 82, and an NMOS transistor 83. The control signal drive circuit 81 couples the gate node of the NMOS transistor 18A to either the power supply voltage VDD or the power supply voltage VSS in response to the control signal pga supplied from the power management unit.

The NMOS transistor 18A is placed in an ON state (i.e., conductive state) when the gate control signal ga is equal to the power supply voltage VDD, thereby providing power supply to the circuit block 14. The NMOS transistor 18A is placed in an OFF state (i.e., nonconductive state) when the gate control signal ga is equal to the power supply voltage VSS, thereby suspending power supply to the circuit block 14. In order to change the state of provision of power supply to the circuit block 14 from the suspended state to the provided state, the control signal drive circuit 81 changes the connection state of the control node (i.e., the gate node of the NMOS transistor 18A) from a state in which the control node is connected to the power supply voltage VSS to a state in which the control node is connected to the power supply voltage VDD. The circuit illustrated in FIG. 15 is configured such that an NMOS is used to control the provision of power supply on the VSS side in contrast to the circuit configuration illustrated in FIG. 5 in which a PMOS is used to control the provision of power supply on the VDD side. Except for such a reversal between the positive side and the negative side, the basic principle of operation is the same between FIG. 5 and FIG. 15.

Figure 16:
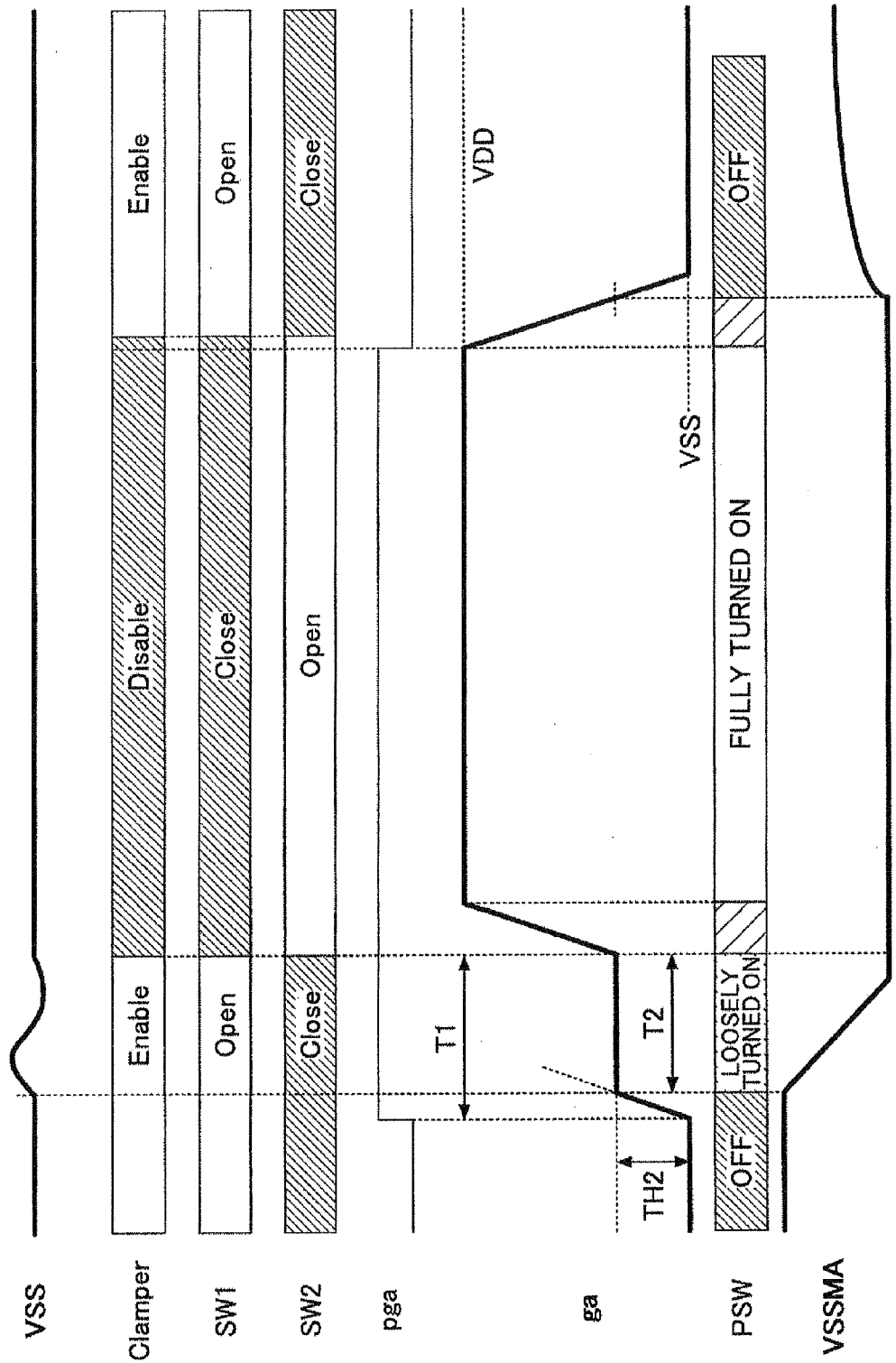
FIG. 16 is a drawing illustrating signal waveforms indicative of the operation of the circuit depicted in FIG. 15.

FIG. 16 is a drawing illustrating signal waveforms indicative of the operation of the circuit depicted in FIG. 15. In an initial state, the switching circuits 86 and 87 are placed in an open state (i.e., nonconductive state) and a closed state (i.e., conductive state) by the control signals SW1 and SW2, respectively, thereby enabling the clamp function of the clamp circuit (clamper) 80. As the control signal pga is changed to HIGH, the voltage of the gate control signal ga starts rising. Upon the rise of the gate control signal ga reaching a threshold voltage TH2 of the NMOS transistor 85, the gate control signal ga is clamped to the threshold voltage TH2 by the clamp function. While the gate control signal ga is clamped to the threshold voltage TH2, the NMOS transistor 18A is in a half-conductive state (i.e., loosely turned-on state), so that a voltage VSSMA gradually drops. After the voltage VSSMA reaches its minimum voltage (which is approximately equal to VSS), the switching circuits 86 and 87 are placed in a closed state (i.e., conductive state) and an open state (i.e., nonconductive state), respectively, to disable the clamp function of the clamp circuit 80 upon the passage of the predetermined time period T1 that starts running from the change of the control signal pga to HIGH. As a result of the disabling of the clamp function, the control signal drive circuit 81 pulls up the voltage of the gate control signal ga to the voltage VDD by a sufficiently strong force.

Figure 17:
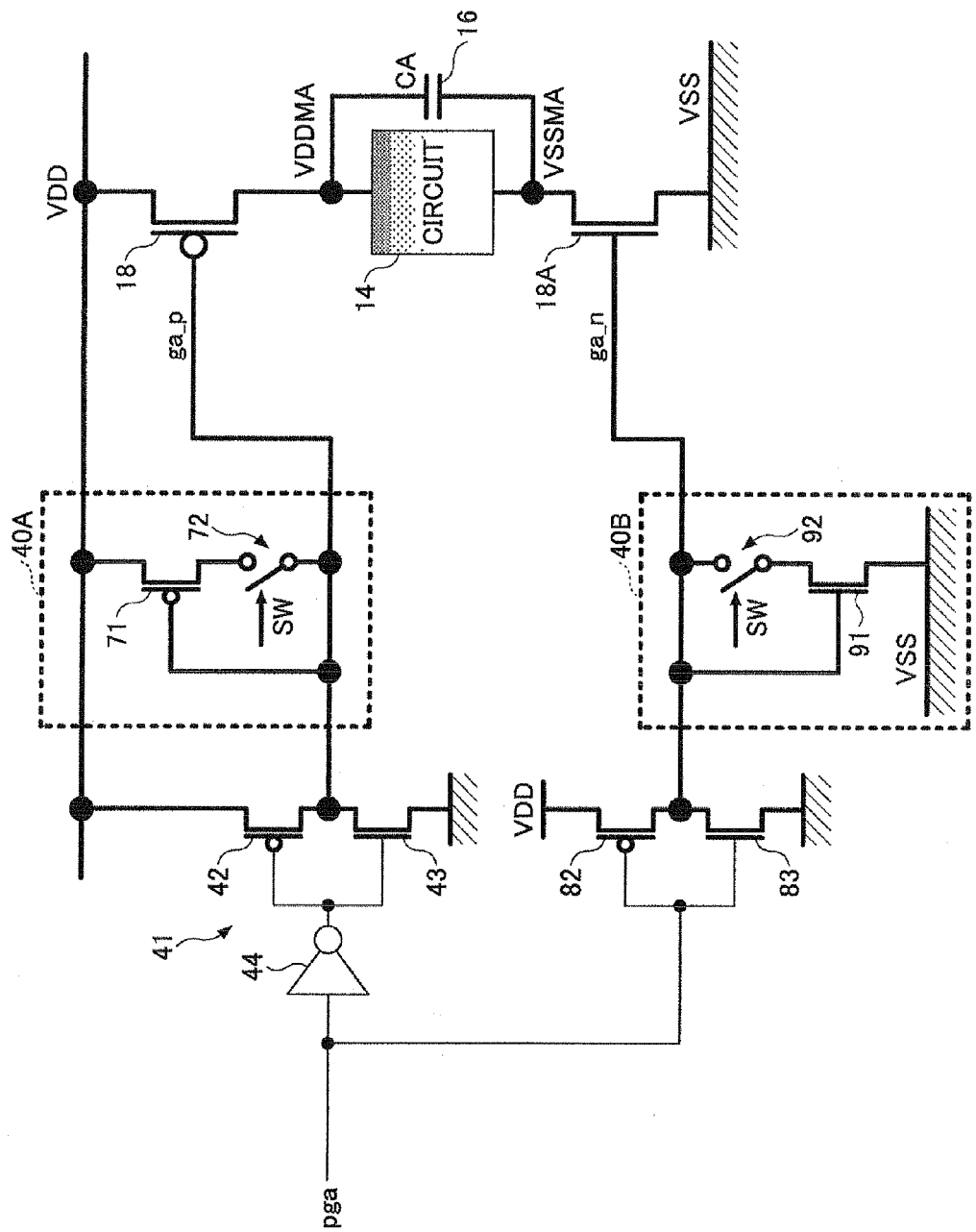
FIG. 17 is a drawing illustrating still another example of the circuit configuration that suppresses the occurrence of an excessive rush current.

FIG. 17 is a drawing illustrating still another example of the circuit configuration that suppresses the occurrence of an excessive rush current. In FIG. 17, the same elements as those of FIG. 14 and FIG. 15 are referred to by the same numerals, and a description thereof will be omitted. In the configuration illustrated in FIG. 17, a configuration that controls the provision of power supply by use of an NMOS transistor on the VSS side is provided in addition to the configuration illustrated in FIG. 14 in which the PMOS transistor is used to control the provision of power supply on the VDD side. A clamp circuit 40B provided on the VSS side includes a PMOS transistor 91 and a switching circuit 92. The connection state of the switching circuit 92 is controlled by a switching control signal SW. With such provision, the control signal SW is used to control whether to enable or disable the clamp operations of the clamp circuits 40A and 40B.

Figure 18:
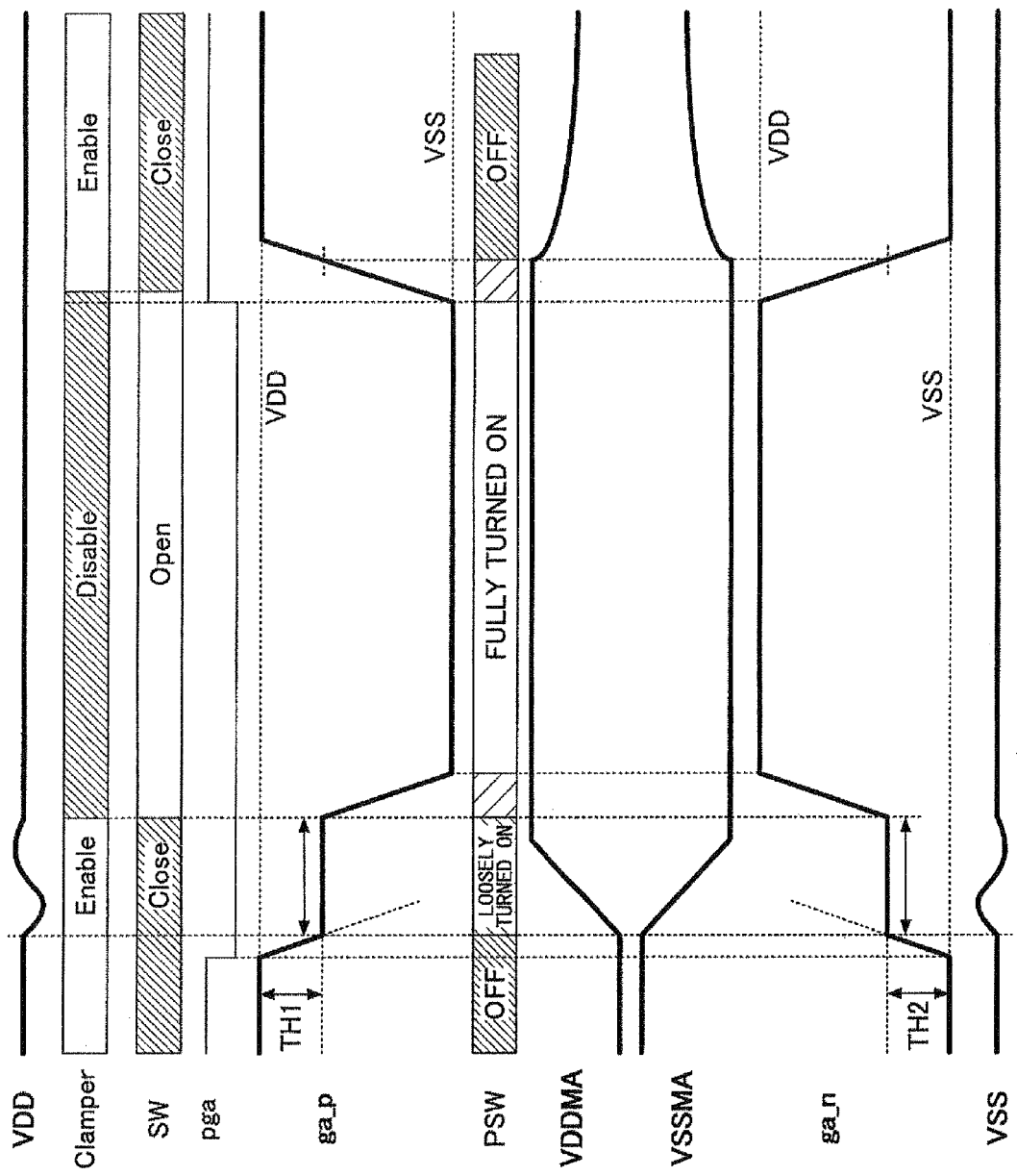
FIG. 18 is a drawing illustrating signal waveforms indicative of the operation of the circuit depicted in FIG. 17.

FIG. 18 is a drawing illustrating signal waveforms indicative of the operation of the circuit depicted in FIG. 17. In an initial state, the switching circuits 72 and 92 are placed in a closed state (i.e., conductive state) by the control signal SW, thereby enabling the clamp functions of the clamp circuits (clampers) 40A and 40B. As the control signal pga is changed to LOW, the voltage of a gate control signal ga_p starts dropping, and the voltage of a gate control signal ga_n starts rising As the gate control signal ga_p drops to reach the threshold voltage TH1 of the PMOS transistor 71, the gate control signal ga_p is clamped to the threshold voltage TH1 by the clamp function. As the gate control signal ga_n rises to reach the threshold voltage TH2 of the NMOS transistor 91, the gate control signal ga_n is clamped to the threshold voltage TH2 by the clamp function. While the gate control signals are clamped to the respective threshold voltages, the MOS transistors 18 and 18A (PSW) are in a half-conductive state (i.e., loosely turned-on state), so that the voltage VDDMA gradually rises, and the voltage VSSMA gradually drops. After the voltages VDDMA and VSSMA reach their respective saturation voltages, the switching circuits 72 and 92 are placed in an open state (i.e., nonconductive state) to disable the clamp functions of the clamp circuits 40A and 40B upon the passage of a predetermined time period that starts running from the change of the control signal pga to LOW. With the disabling of the clamp functions, the voltage of the gate control signal ga_p is pulled down to the ground voltage VSS by a sufficiently strong force, and the voltage of the gate control signal ga_n is pulled up to the power supply voltage VDD by a sufficiently strong force.

Figure 19:
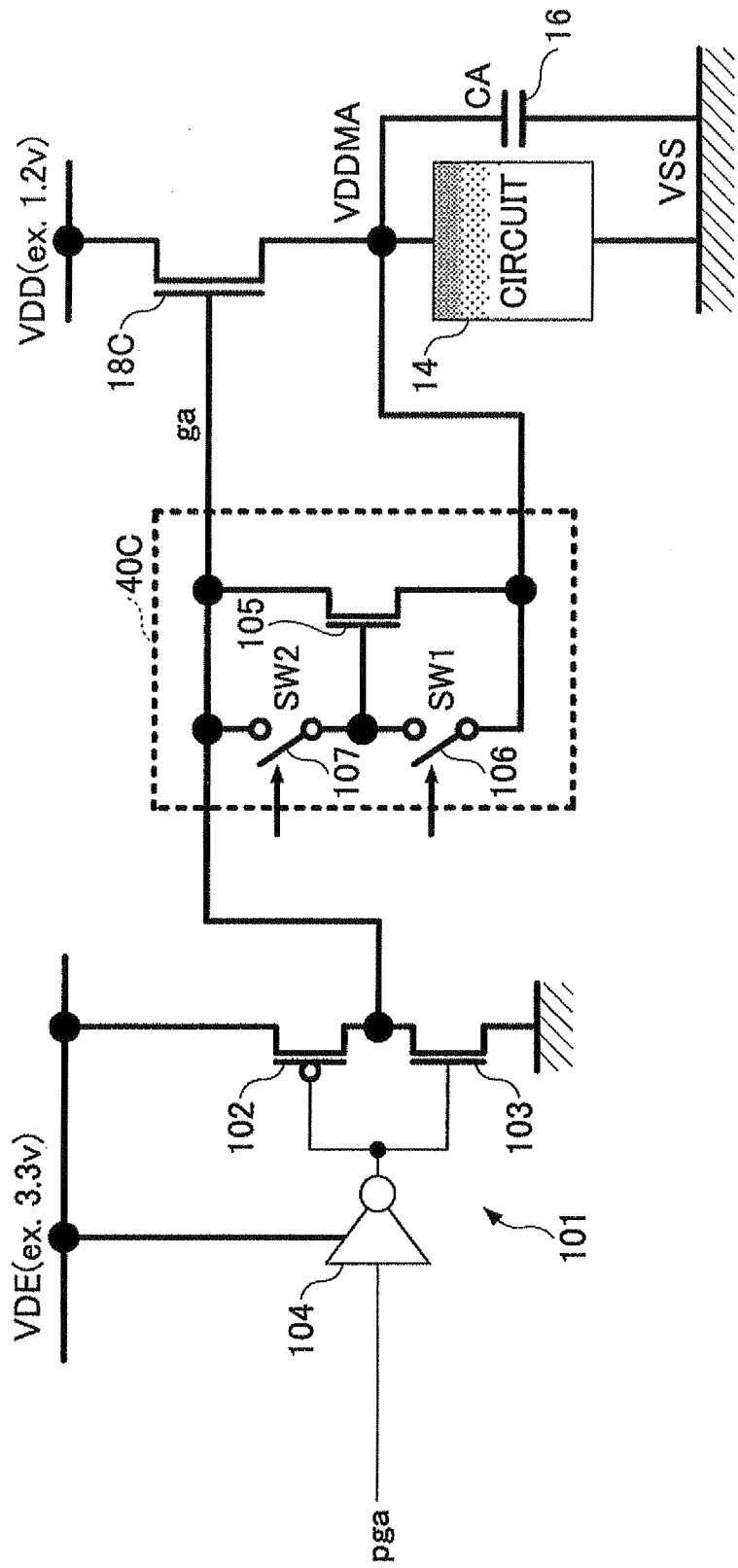
FIG. 19 is a drawing illustrating still another example of the circuit configuration that reliably suppresses the occurrence of an excessive rush current.

FIG. 19 is a drawing illustrating still another example of the circuit configuration that suppresses the occurrence of an excessive rush current. In FIG. 19, the same elements as those of FIG. 5 are referred to by the same numerals, and a description thereof will be omitted. In the configuration illustrated in FIG. 19, a clamp circuit 40C and a control signal drive circuit 101 are used to control the gate control signal ga supplied to the gate of an NMOS transistor 18C. The clamp circuit 40C and the control signal drive circuit 101 are situated between the power management unit and the NMOS transistor 18C. The control signal drive circuit 101 drives the gate control signal ga in response to the control signal pga generated by the power management unit. The clamp circuit 40C clamps the voltage of the gate control signal ga to a predetermined voltage.

The clamp circuit 40C includes an NMOS transistor 105 and switching circuits 106 and 107. Respective connection states of the switching circuits 106 and 107 are controlled by switching control signals SW1 and SW2, respectively. The control signal drive circuit 101 includes an inverter 104, a PMOS transistor 102, and an NMOS transistor 103. The control signal drive circuit 101 couples the gate node of the NMOS transistor 18C to either a high power supply voltage (or boosted voltage) VDE or the power supply voltage VSS in response to the control signal pga supplied from the power management unit. The high power supply voltage (or boosted voltage) VDE may be 3.3 V, for example, when the power supply voltage VDD is 1.2 V, for example.

The NMOS transistor 18AC is placed in an ON state (i.e., conductive state) when the gate control signal ga is equal to the high power supply voltage VDE, thereby providing power supply to the circuit block 14. The NMOS transistor 18C is placed in an OFF state (i.e., nonconductive state) when the gate control signal ga is equal to the power supply voltage VSS, thereby suspending power supply to the circuit block 14. In order to change the state of provision of power supply to the circuit block 14 from the suspended state to the provided state, the control signal drive circuit 101 changes the connection state of the control node (i.e., the gate node of the NMOS transistor 18C) from a state in which the control node is connected to the power supply voltage VSS to a state in which the control node is connected to the high power supply voltage VDE. The circuit illustrated in FIG. 19 is configured such that an NMOS is used to control the provision of power supply on the VDD side in contrast to the circuit configuration illustrated in FIG. 5 in which a PMOS is used to control the provision of power supply on the VDD side. The basic principle of operation is the same between FIG. 5 and FIG. 19.

Figure 20:
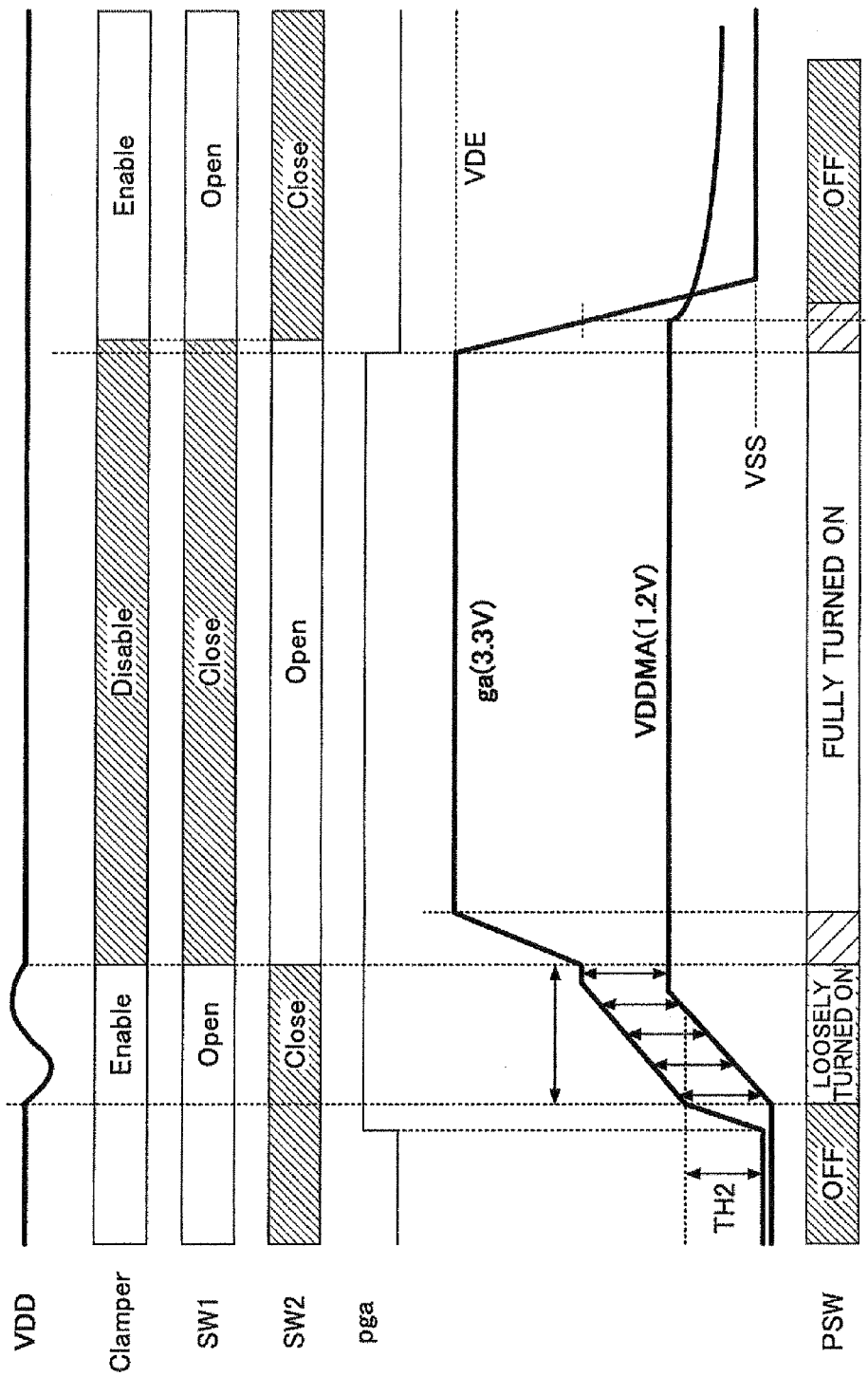
FIG. 20 is a drawing illustrating signal waveforms indicative of the operation of the circuit depicted in FIG. 19.

FIG. 20 is a drawing illustrating signal waveforms indicative of the operation of the circuit depicted in FIG. 19. In an initial state, the switching circuits 106 and 107 are placed in an open state (i.e., nonconductive state) and a closed state (i.e., conductive state) by the control signals SW1 and SW2, respectively, thereby enabling the clamp function of the clamp circuit (clamper) 40C. As the control signal pga is changed to HIGH, the voltage of the gate control signal ga starts rising. Upon rising, the gate control signal ga is clamped to the sum of the threshold voltage TH2 and the source voltage (VDDMA) of the NMOS transistor 105. While the gate control signal ga is clamped to TH2+VDDMA, the NMOS transistor 18C is in a half-conductive state (i.e., loosely turned-on state), so that the voltage VDDMA gradually rises. When this happens, the gate control signal ga also gradually rises as it is equal to TH2+VDDMA. After the voltage VDDMA reaches its maximum voltage (which is approximately equal to VDD), the switching circuits 106 and 107 are placed in a closed state (i.e., conductive state) and an open state (i.e., nonconductive state), respectively, to disable the clamp function of the clamp circuit 40C upon the passage of the predetermined time period that starts running from the change of the control signal pga to HIGH. As a result of the disabling of the clamp function, the control signal drive circuit 101 pulls up the voltage of the gate control signal ga to the voltage VDE by a sufficiently strong force.

According to at least one embodiment, the control signal that controls the conduction state of the power supply switch is clamped to a predetermined voltage, so that the conduction state of the power supply switch is set to a desired state. This arrangement can reduce the risk of having an excessive current flowing through the power supply switch, thereby making it possible to safely resume the provision of power supply to the core circuit at high speed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor integrated circuit, comprising:
   a core circuit;
   a power supply switch situated on a path providing a current to the core circuit and configured to control a state of current supply to the core circuit in response to a control signal applied to a control node;
   a clamp circuit configured to clamp a voltage of the control signal; and
   a switching circuit configured to control whether to enable or disable a clamp operation of the clamp circuit,
   wherein the clamp circuit supplies the control signal having a voltage which is substantially lower than a power supply voltage by a threshold voltage of the switching circuit.

2. The semiconductor integrated circuit as claimed in claim 1, further comprising a control signal driving circuit configured to switch between a state in which the control node is coupled to a first power supply voltage and a state in which the control node is coupled to a second power supply voltage.

3. The semiconductor integrated circuit as claimed in claim 1, wherein the power supply switch is placed in a half-conductive state in response to the control signal having the clamped voltage.

4. The semiconductor integrated circuit as claimed in claim 1, wherein the clamp operation of the clamp circuit is enabled when changing the state of current supply to the core circuit from a suspended state to a provided state, and is thereafter changed to a disabled state.

5. The semiconductor integrated circuit as claimed in claim 4, wherein the clamp operation of the clamp circuit is changed to the disabled state after a power supply voltage applied to the core circuit reaches a first voltage level.

6. A semiconductor integrated circuit, comprising:
a core circuit;
a power supply switch situated on a path providing a current to the core circuit and configured to control a state of current supply to the core circuit in response to a control signal applied to a control node;
a clamp circuit configured to clamp a voltage of the control signal;
a switching circuit configured to control whether to enable or disable a clamp operation of the clamp circuit; and
a voltage detecting circuit configured to generate a voltage detection signal responsive to a power supply voltage applied to the core circuit,
wherein the clamp operation of the clamp circuit is enabled or disabled in response to the voltage detection signal of the voltage detecting circuit.

7. The semiconductor integrated circuit as claimed in claim 6, wherein the voltage detecting circuit is configured to refrain from changing the voltage detection signal responsive to the power supply voltage applied to the core circuit even if the power supply voltage exhibits fluctuation while the core circuit is operating.

8. The semiconductor integrated circuit as claimed in claim 7, wherein the voltage detecting circuit is set or reset in response to a signal that indicates whether to provide or not to provide power supply to the core circuit.

9. The semiconductor integrated circuit as claimed in claim 1, wherein the power supply switch is a first MOS transistor having a gate to which the control signal is applied, and the clamp circuit includes a second MOS transistor having an identical conduction type to the first MOS transistor, and wherein a gate and drain of the second MOS transistor are coupled to the gate of the first MOS transistor while the clamp operation of the clamp circuit is in an enabled state.

10. The semiconductor integrated circuit as claimed in claim 9, wherein the switching circuit is configured to control where the gate of the second MOS transistor is connected.

11. The semiconductor integrated circuit as claimed in claim 1, wherein the switching circuit includes a first MOS transistor, a threshold voltage of which is substantially the same as a threshold voltage of a second MOS transistor included in the clamp circuit.

* * * * *